US006608492B1

United States Patent
Entenmann

(10) Patent No.: US 6,608,492 B1
(45) Date of Patent: Aug. 19, 2003

(54) AC IMPEDANCE BRIDGE

(76) Inventor: Richard Carl Entenmann, 5551 Calumet Ave., La Jolla, CA (US) 92037

( * ) Notice: Subject to any disclaimer, the term of this patent is extended or adjusted under 35 U.S.C. 154(b) by 13 days.

(21) Appl. No.: 09/934,014

(22) Filed: Aug. 20, 2001

(51) Int. Cl.$^7$ .............................................. G01R 27/08
(52) U.S. Cl. .................... 324/706; 374/183; 327/563
(58) Field of Search ................... 324/606, 656, 324/704, 705, 709, 725; 374/183; 327/563

(56) References Cited

U.S. PATENT DOCUMENTS

| 3,895,292 | A | * | 7/1975 | Zair et al. ...................... 324/62 |
| 5,406,223 | A | | 4/1995 | Vulih et al. .................. 330/258 |
| 5,757,236 | A | | 5/1998 | Ortiz et al. .................. 330/296 |
| 6,046,642 | A | | 4/2000 | Brayton et al. ............. 330/296 |
| 6,100,759 | A | | 8/2000 | Sirna et al. ................. 330/252 |
| 6,175,279 | B1 | | 1/2001 | Ciccarelli et al. ............ 330/296 |
| 6,255,904 | B1 | | 7/2001 | Capodivacca et al. ........ 330/51 |

OTHER PUBLICATIONS

Feng, et al. *ac ohm meter for low–temperature thermometry* Review Sci. Instrum., May, 1999, pp. 2365–2371, v. 70(5), American Institute of Physics, USA.

Brandt, et al, *Low temperature thermometry in high magnetic fields* Rev. Sci. Instrum., Jan., 1999, pp. 104–110, v. 70(1), American Institute of Physics, USA.

Kato, et al. *New apparatus for the precise temperature control in 3He refrigerator* Rev. Sci. Instrum. Jan., 1998, pp. 164–167, v. 69(1) Amer. Inst. Physics, USA.

Sutton, *Current source with matched common mode output impedances* Rev. Sci. Instrum. January, 1998, pp. 164–167, v. 69(1) Amer. Inst. Physics, USA.

Chaussy, et al. *A very sensitive technique for measuring the temperature derivative of electrical resistance between 4 and 300 K* Rev. Sci. Instrum. Aug., 1992, pp. 3953–3958, v. 63(8) Amer. Inst. Physics USA.

Koon, *What do you measure when you measure resistivity?* Rev. Sci. Instrum, Jan. 1992, pp. 207–210 v. 63(1) American Institute of Physics, USA.

(List continued on next page.)

*Primary Examiner*—Christine Oda
*Assistant Examiner*—Etienne P LeRoux
(74) *Attorney, Agent, or Firm*—Thomas J. Tighe, Esq.

(57) ABSTRACT

The output of a preamplifier is communicated to an active feedback circuit which drives the primary of a balancing transformer the secondary of which is connected in series with an impedance under test (IUT), the terminals of the series connection are communicated to respective differential inputs of the preamplifier. The feedback circuit automatically drives the preamplifier input toward balance, balance being achieved when the signal across the secondary equals the signal across the IUT in magnitude but opposite in phase. A DC blocking circuit is interposed between the series connection and the preamplifier for blocking preamplifier bias current from loading and heating the IUT. At balance an active equalizing transfer function circuit nulls any potential across the blocking circuit.

7 Claims, 3 Drawing Sheets

OTHER PUBLICATIONS

Cho, et al. *AC bridge for high–temperature magnetic thermometry* Rev. Sci. Instrum. Aug., 1990 pp. 2232–2235 v. 61(8) American Institute of Physics, USA.

Bruschi, et al. *New high–precision bridge for low–resistance thermometry* Rev. Sci. Instrum, Sep., 1986 pp. 2361–2362, v. 57 (9) Amer. Inst. Physics, USA.

Corson, *Computer–compatible, self–contained, prescision ac resistance bridge suitable for thermometry* Rev. Sci. Instrum. Dec., 1985 pp. 2310–2311 v. 56(12) Amer. Inst. Physics, USA.

Narci, *Low–noise four–terminal ac resistance bridge* Rev. Sci. Instrum. May, 1985 pp. 773–774 v. 56(5) American Institute of Physics, USA.

Bruschi, et al. *Precise temperature controller for resistance thermometers* Rev. Sci. Instrum. Mar., 1985 pp. 427–429 v. 56(3) American Institute of Physics, USA.

Gearhart, et al. *Simple high–stability potentiometric ac bridge circuits for high–resolution low–temperature resistance thermometry* Rev. Sci. Instrum., Nov., 1975 pp. 1493–1499 v. 46(11) Amer. Inst. Physics, USA.

Anderson, *Low–Noise ac Bridge for Resistance Thermometry at Low Temperatures* Rev. Sci. Instrum. Oct., 1973 pp. 1475–1477, v. 44(10) Amer. Inst. Physics, USA.

*Low Noise Precision Difet Operational Amplifier*, Burr–Brown IC Data Book–Linear Products pp. 1.27–2.37 and Figs. 17 & 18, 1994, Burr–Brown Corporation, USA.

* cited by examiner

AC IMPEDANCE BRIDGE

This invention relates in general to self-balancing impedances bridges, and in particular to such bridges adapted for temperature control at extremely low temperatures, e.g. at milliKelvin levels.

BACKGROUND OF INVENTION

FIG. 1 herein illustrates a prior art AC (alternating current) impedance bridge useful for monitoring the temperature of a cryogenic environment by measuring the resistance of a temperature dependent resistor $R_X$ in the environment. At low temperatures, below 1 degree kelvin, the prior art cannot measure high value resistors of above 100 K (kilo) ohms with sufficiently low power while achieving acceptable high resolution. The prior art works effectively at low resistance of below 10 K ohms, but modem resistive temperature sensors have values in the 100 K ohms to a few megohms, and many cryogenic applications and experiments need extremely low excitation powers to excite the resistive sensors in order to avoid self-heating of the sensors. The need for low excitation powers for the higher ohmage sensors has raised the problem of excess DC (direct current) bias currents from the prior arts' preamplifiers 6. Sensors need to be measured with extremely low input voltage noise, on the order of below 10 nanovolts (RMS, root mean square, per square root Hertz at typically 16 Hz) along with low current noise of below 10 femto amps. At low temperatures in the millikelvin range, these sensors produce thermal noise, for example, approximately 1 to 4 nanovolts per square root Hz (Hertz) at 300 millikelvin for a 100 K ohm to 1 M (megohm) ohm resistor. The prior art is lacking in that the DC bias current is sufficiently high to self-heat the higher ohmage sensors. For accurate temperature measurements in the millikelvin range, the DC bias current flowing through a sensor needs to be near 1 pico amp or less. The prior art has bias currents in excess of 1 pico amp.

One solution would be to use a semiconductor operational amplifier with a bias current of the required 1 pico amp or less as the preamplifier 6, but unfortunately such amplifiers have an unacceptably high input noise voltage. This is because there is an inherent characteristic in such amplifiers: the lower the DC bias current, the higher the input voltage noise.

This invention overcomes these problems, and others, by providing a circuit that eliminates excess DC bias current while avoiding any significant increase in noise voltage communicated to a preamplifier.

SUMMARY OF THE INVENTION

An object of this invention is to provide a means and method for eliminating undesirable DC bias current from the input of a preamplifier according to this invention without an undesirable increase in measurement noise.

A further object of this invention is to provide a means and method for eliminating undesirable DC current from the input of a preamplifier according to this invention without undesirable loading the unknown impedance.

These objects, and others expressed or implied in this document, are accomplished by a bridge including an amplifier (commonly called a preamplifier) having gain and including differential inputs; a transformer, a secondary of the transformer being connected in series with the unknown impedance, the terminals of the series connection communicating with respective differential inputs of the amplifier; a transfer function, communicating with the output of the amplifier and exciting the primary of the transformer, for automatically driving the bridge toward balance, balance being achieved when the signal across the secondary equals the signal across the unknown impedance; and a circuit for blocking any DC bias current (direct current caused by an inherent bias of the inputs of the amplifier) from flowing through the unknown impedance. In a preferred embodiment the blocking circuit includes a pair of direct current blocking capacitors interposed between respective terminals of the series connection and the amplifier inputs, and a current shunt communicating with each capacitor on the capacitor's amplifier side. Also in the preferred embodiment an equalizing transfer function includes a voltage follower whose input communicates with the unknown impedance's terminal of the series connection, and whose output communicates with said each capacitor through said each capacitor's current shunt, the input impedance of the follower being high enough and bias current being low enough to avoid significantly loading and heating the unknown impedance. In alternative embodiments, one end of the unknown impedance communicates with a reference potential, e.g. analog ground, so no DC bias current can be sourced from that end, and DC bias current is blocked from the other end by a blocking circuit which is equalized in signal potential by the equalizing transfer function.

This invention also presents a preamplifier configured from two sets of paralleled operational amplifiers feeding respective amplifiers which in turn feed the differential inputs of a single amplifier to convert the preamplifier output to single-ended. The paralleled input amplifiers substantially reduce voltage noise over conventional amplifiers, while the concurrent increase in DC bias current is not detrimental to a bridge according to this invention due the bias current elimination feature of this invention.

DESCRIPTION OF THE PREFERRED EMBODIMENT

Figure 1:
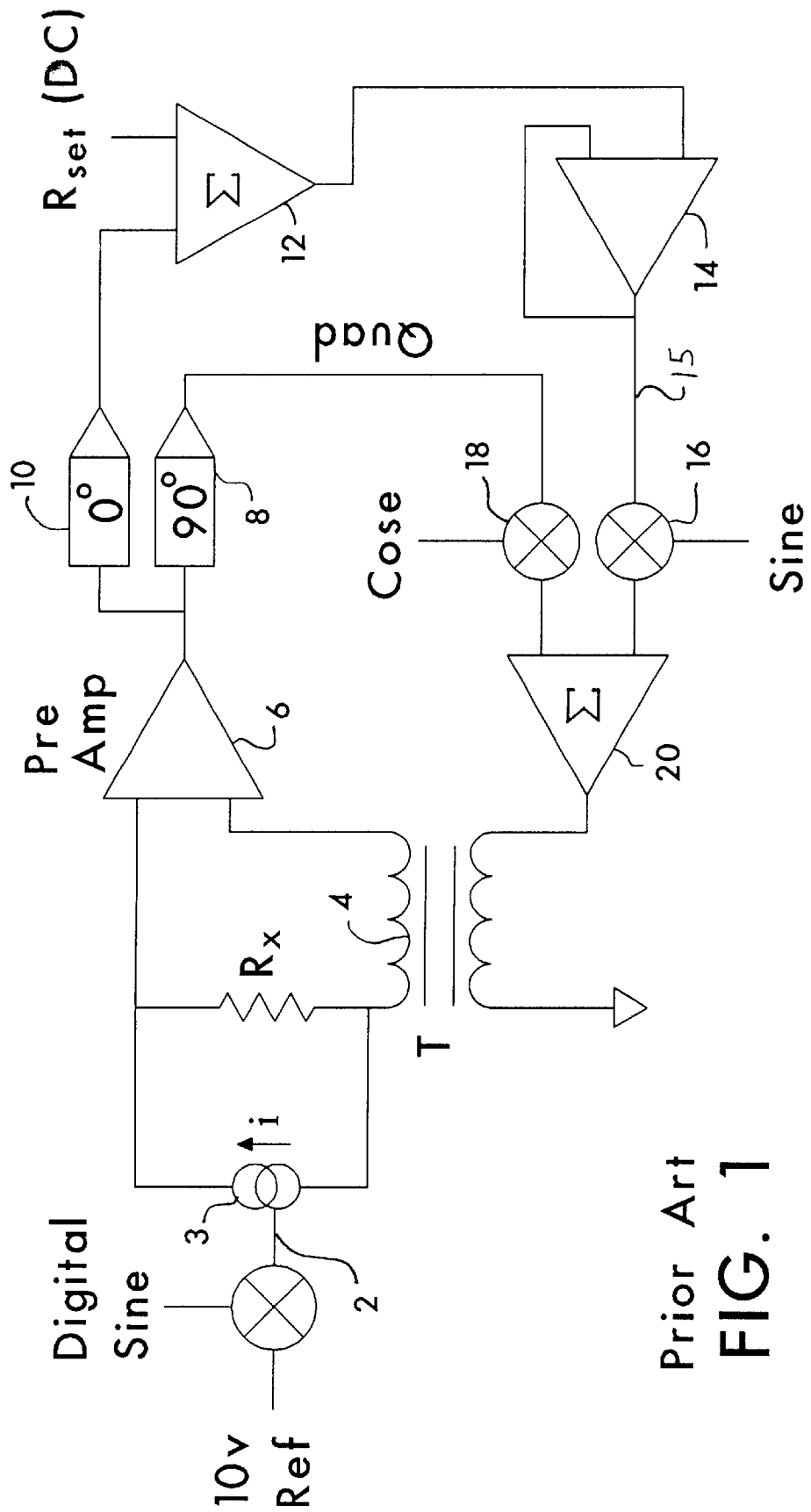
FIG. 1 is a diagrammatic illustration of a prior art AC resistance bridge.

Referring to FIG. 1, illustrated is a prior art AC resistance bridge. As illustrated, a 10 volt DC reference is multiplied by sequential samples of a digitized sine function. The product sinusoidal signal 2 is communicated to a high impedance current generator 3 comprised of a circuit of operational amplifiers and precision resistors. The current generator is connected in parallel to the unknown impedance being measured, $R_X$. The output impedance of the current generator is extremely high with respect to $R_X$ so as to not have any significant effect on the measurements of $R_X$. The secondary 4 of a balancing transformer T is in series with $R_X$, and the terminals of this series circuit communicate with respective inputs of a preamplifier 6. The prior art preamplifier is typically characterized by high impedance, low noise of 1 to 30 nano volts, with DC bias current of 10 to 100 pico amps. The preamplifier amplifies any differential between its inputs sufficiently for further processing. The secondary 4 of the balancing transformer is driven by a feedback circuit. In the feedback circuit, the quadrature and in-phase components of the signal output of the preamplifier are detected and separately integrated, 8 and 10 respectively. The integrated in-phase component is summed 12 with a DC voltage, $R_{SET}$, and buffered by a voltage follower 14 whose output 15 is the measurement output. $R_{SET}$ is proportional to a resistance set point or offset that a user sets to select the temperature about which the temperature is be controlled or servoed. The integrated quadrature component and the output of the buffer 14 are separately multiplied by cosine and sine functions, 18 and 16 respectively, and the product signals are communicated to a summing circuit 20 the output of which drives the primary of the balancing transformer T. The gain of the preamplifier, the parameters of the feedback circuit, and the turns ratio of the transformer T are such that both phases are automatically balanced which occurs when $iR_X=V$ where V is the voltage across the secondary of T.

Figure 2:
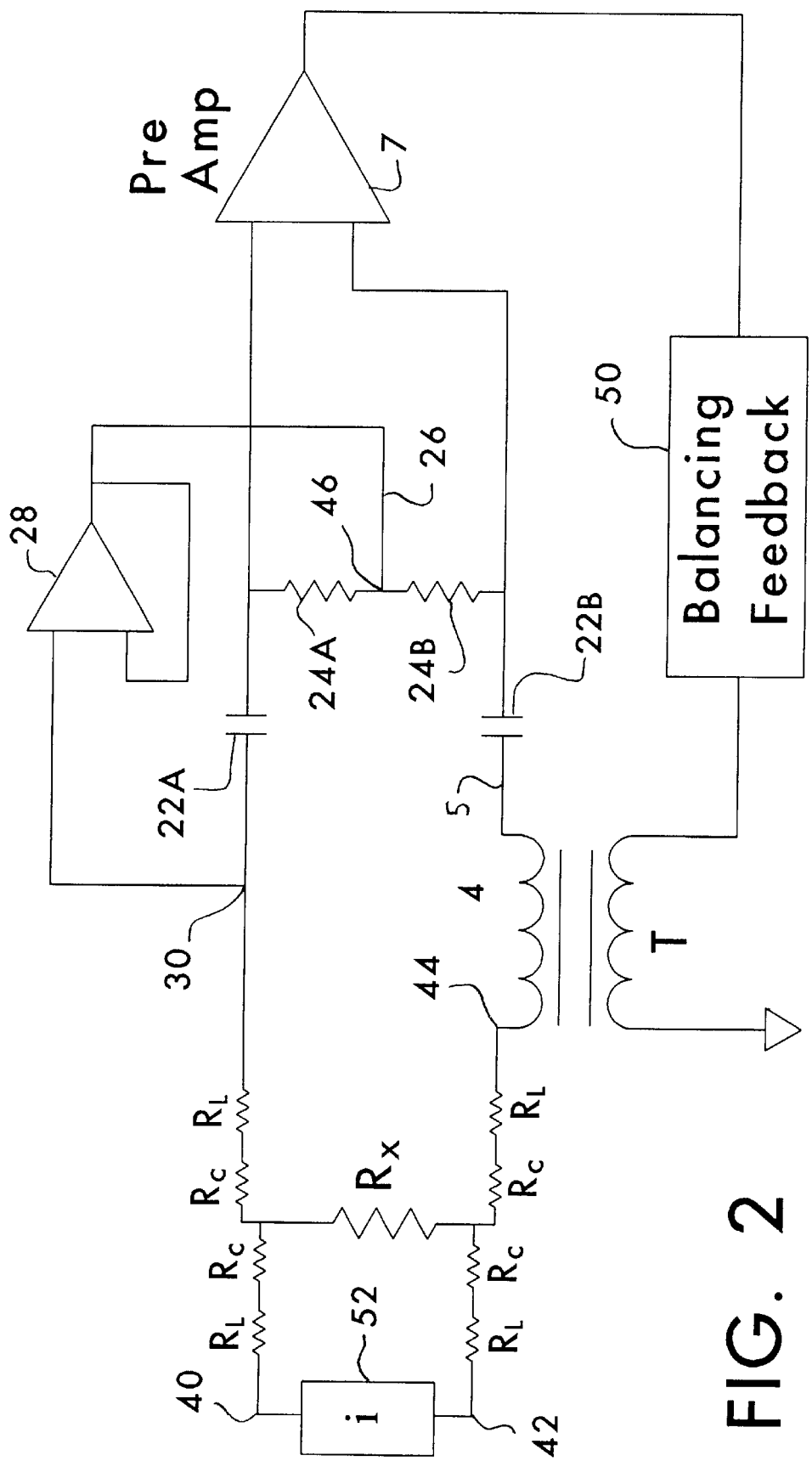
FIG. 2 is a functional diagram illustrating a preferred embodiment of this invention.

Referring to FIG. 2, a novel bridge according to this invention is illustrated as including a preamplifier 7 with a novel DC bias current elimination circuit at its input. An AC current generator 52 excites an unknown impedance $R_X$. For temperature sensing applications, the unknown impedance is a temperature sensor which is typically a four wire device containing a temperature dependent resistance ($R_X$) with unavoidable contact resistances, $R_C$, to allow the internal connections. The four terminals allow independent connections for the current and voltage leads. The $R_C$ resistances are usually small compared to $R_X$ but may be as large as 30% of $R_X$. The four $R_C$ resistances are not equal and usually are unknown. For measuring temperature in a cryogenic environment, the sensor is typically remote from the impedance bridge and is connected by four long lead wires, e.g. ten feet, each of which has a resistance, $R_L$. The four $R_L$ values are typically not equal and may range from 1 ohm to 1 K ohm depending on the type of wire used. In series with unknown impedance $R_X$ is the secondary 4 of a balancing transformer T. A feedback transfer function 50 excites the primary of the transformer and automatically drives the bridge toward balance, balance being acchieved when the signal across the secondary equals the signal across $R_X$ in magnitude but opposite in phase. DC blocking capacitors, 22A and 22B, are interposed between opposite ends of the series circuit ($R_X$ in series with secondary 4 of T) and their respective preamplifier 7 inputs in order to block the flow of any DC bias current through $R_X$. In order to provide discharge paths for the capacitors, shunt resistors 24A and 24B provide a current path from the preamplifier sides of the capacitors, 22A and 22B respectively, to a virtual common mode potential 26 at the output of an operational amplifier 28 configured as a voltage follower, unity gain, the input of which is connected to a point 30 at which the common mode potential is felt. The capacitors completely block all DC currents from the preamplifier that would otherwise flow through $R_X$ thus self heating it. Operational amplifier 28 does allow some bias current to flow but is preferably chosen to have 1 pico amp or less of bias current to minimize the self-heating of $R_X$. Operational amplifier 28 can have a noise voltage of 100 nano volts or larger without affecting the measurement. The output of 28 is used to discharge the capacitors, 22A and 22B, thus preventing voltage buildup on the preamplifier side of the capacitors. The shunt resistors, 24A and 24B, preferably have a resistance four orders of magnitude larger than $R_X$. This minimizes the noise across $R_X$ by reducing the thermal noise current generated by 24A and 24B. The resistor $R_X$ is not loaded by the DC elimination circuitry because the transformer servoes signal point 5 to exactly equal 30 and this voltage drives the common point between 24A and 24B. Without the transformer, the DC elimination circuitry would shunt $R_X$ thus preventing a true reading of $R_X$. Operational amplifier 28 by forcing the junction of 24A and 24B to equal 30 and 5 allows connection of a ground connection on either terminal of the current generator without loading $R_X$. Operational amplifier 28 further allows line resistance or contact resistances to be present between $R_X$ and either terminal of the current generator, transformer 4, and point 30 without allowing 22A/22B and 24A/24B to shunt $R_X$.

In practice the sensor $R_X$ must have a return path to ground to prevent its voltage potential from floating and to return the small DC bias current of operational amplifier 28. The embodiment shown in FIG. 2 is preferred because it allows the current generator to be returned to ground at one of many points and this is why the ground connection is not shown. The preferred embodiment blocks all bias currents from the preamplifier. Typically the ground return is connected to 40 or alternatively 42. By dedicating a ground point at 40 or 42, the circuit can be simplified by elimination of one capacitor and one resistor. For example, in a second embodiment, there is a ground point at 42, and capacitor 22B has been replaced with a short and resistor 24B has been eliminated. In this embodiment a bias current from the preamplifier can flow through transformer 4 and the line and contact resistances, $R_L$ and $R_C$ to the ground point. This can cause heating in the line and contact resistances but no heating in $R_X$. Similarly, a third embodiment includes grounding point 40, replacing capacitor 22A by a short, and eliminating shunt resistor 24A.

Figure 3:
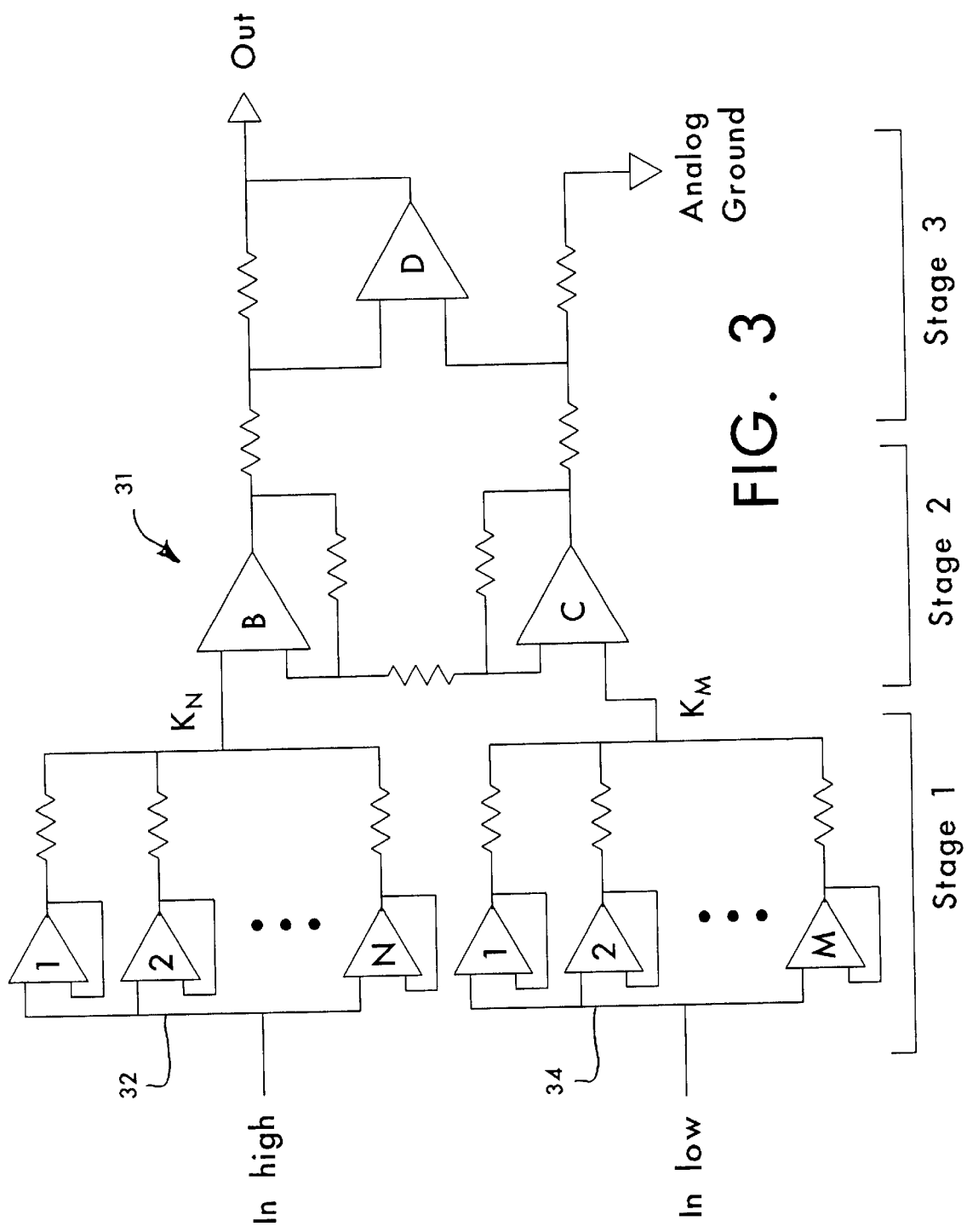
FIG. 3 is a functional diagram illustrating in a further detail an exemplary preamplifier according to this invention.

Referring to FIG. 3, illustrated in three stages is an exemplary preamplifier, generally designated 31, suitable for this invention. Stage 1 includes two sets of paralleled operational amplifiers, 32 and 34, all configured as voltage followers, and labeled 1 through N and 1 through M, respectively. The outputs of the sets are summed, $K_N$ and $K_M$, to a pair of operational amplifiers B and C, respectively, in stage 2. The stage 2 amplifiers are preferably of very low noise and they provide the desired gain of the preamplifier . The amplified signals from B and C feed into stage 3. Stage 3 includes a differential amplifier D that resolves the differential signals from B and C into a single ended signal out (Out) that is referenced to analog ground. Stage 1 takes advantage of the fact that when voltage noises are summed, the resultant noise is reduced by a factor of square root of N and that the current noise is increased by a factor of square root of N. As an example, a commonly available operational amplifier is specified to have 16 nanovolts of voltage noise and 0.6 femto amps of current noise with a bias current of 1 pico amp. Thus by making N=M=25 the example preamplifier will have about 3 nanovolts of voltage noise, 3 femto amps of current noise, and 25 pico amps of DC bias current per input. This would allow measurement of a 1 megohm resistor with approximately 10 nanovolts or less of resolution at low temperatures.

A further benefit of the invention is: The invention allows the impedance $R_X$ to be excited by a parallel DC current generator without locking up the preamplifier This might be used to purposely heat the sensor with a DC current while measuring the value of the impedance $R_X$ with the AC current, or other uses.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as defined by the following claims. For example, the amplifier 28 in FIG. 2 can be embodied by any voltage follower circuit, not necessarily an "operational amplifier", which has input impedance high enough and DC bias current low enough to avoid undesirable loading and heating of $R_x$. Also the DC bias current blocking circuit illustrated in FIG. 2 need not have the exact shunting configuration or components as illustrated in FIG. 2, any circuit which provides sufficient shunting to avoid charge build-up at the input of the preamplifier and a connection point for the equalizing transfer function can be used.

I claim:

1. For an unknown impedance across which a signal is excited by a reference alternating current, an impedance bridge for measuring the impedance comprising:

(a) an amplifier having gain and including differential inputs, (b) a transformer, a secondary of the transformer being connected in series with the unknown impedance, the terminals of the series connection communicating with respective differential inputs of the amplifier, (c) a transfer function, communicating with the output of the amplifier and exciting the primary of the transformer, for automatically driving the bridge toward balance, balance being achieved when the signal across the secondary equals the signal across the unknown impedance in magnitude but opposite in phase, (d) a circuit for blocking direct current caused by an inherent bias of the inputs of the amplifier from flowing through the unknown impedance, and (e) a transfer function for equalizing signal potential across the blocking circuit.

2. The bridge according to claim 1 further comprising:

(a) a pair of direct current blocking capacitors interposed between respective terminals of the series connection and the amplifier inputs, (b) a current shunt communicating with each capacitor on the capacitor's amplifier side, and (c) a voltage follower whose input communicates with the unknown impedance's terminal of the series connection, and whose output communicates with said each capacitor through said each capacitor's current shunt, the input impedance of the follower being high enough and bias current being low enough to avoid significantly loading and heating the unknown impedance.

3. The bridge according to claim 2 wherein each current shunt comprises a resistive network, and wherein the output of the follower communicates with a common connection between the resistive networks.

4. The bridge according to claim 1 further comprising:

(a) a reference potential communicating with an end of the unknown impedance remote from the transformer secondary, (b) a direct current blocking capacitor interposed between the secondary's terminal of the series connection and its respective amplifier input, (c) a current shunt communicating with the blocking capacitor on the capacitor's amplifier side, and (d) a voltage follower whose input communicates with the unknown impedance's terminal of the series connection, and whose output communicates with the blocking capacitor through the capacitor's current shunt, the input impedance of the follower being high enough and the bias current being low enough to avoid significantly loading and heating the unknown impedance.

5. The bridge according to claim 4 wherein the current shunt comprises a resistive network, and wherein the output of the follower communicates with the resistive network at an end remote from its communication point with the capacitor.

6. The bridge according to claim 1 further comprising:

(a) a reference potential communicating with the junction of the unknown impedance and the transformer secondary, (b) a direct current blocking capacitor interposed between the unknown impedance's terminal of the series connection and its respective amplifier input, (c) a current shunt communicating with the blocking capacitor on the capacitor's amplifier side, and (d) a voltage follower whose input communicates with the unknown impedance's terminal of the series connection, and whose output communicates with the blocking capacitor through the capacitor's current shunt, the input impedance of the follower being high enough and the bias current being low enough to avoid significantly loading and heating the unknown impedance.

7. The bridge according to claim 6 wherein the current shunt comprises a resistive network, and wherein the output of the follower communicates with the resistive network at an end remote from its communication point with the capacitor.

* * * * *